US005156280A

United States Patent [19]

Joist

[11] Patent Number: 5,156,280

[45] Date of Patent: Oct. 20, 1992

[54] COMPONENT CARRIER

[75] Inventor: Michael Joist, Gaggenau, Fed. Rep. of Germany

[73] Assignee: Schroff GmbH, Straubenhardt, Fed. Rep. of Germany

[21] Appl. No.: 735,274

[22] Filed: Jul. 24, 1991

[30] Foreign Application Priority Data

Aug. 21, 1990 [DE] Fed. Rep. of Germany ....... 4026396

[51] Int. Cl.[5] .............................................. A47G 19/08

[52] U.S. Cl. .................................. 211/41; 403/406.1; 403/387; 361/415

[58] Field of Search ............... 211/41, 184; 248/221.3, 248/222.1, 224.4; 403/406.1, 387; 361/415

[56] References Cited

U.S. PATENT DOCUMENTS 3,034,511 5/1962 Guichard ............................ 211/184
3,349,924 10/1967 Maurer et al. ........................ 211/41
3,664,510 5/1972 Kerschbaum ......................... 211/41
3,878,438 4/1975 Weismann ........................ 211/41 X
3,954,184 5/1976 Mendenhall ......................... 211/184
4,022,326 5/1977 Marconi ............................... 211/41
4,328,897 3/1982 Weiss .................................. 211/41
4,508,228 4/1985 Erlam .
4,619,428 10/1986 Bailey ......................... 248/222.1 X
4,669,616 6/1987 Mazura ................................ 211/41
4,768,661 9/1988 Pfeifer ................................ 211/184
5,033,627 7/1991 Brown .................................. 211/41

FOREIGN PATENT DOCUMENTS 64493 11/1968 Fed. Rep. of Germany .
1812659 7/1970 Fed. Rep. of Germany .
7716440 11/1977 Fed. Rep. of Germany .
3209205 9/1983 Fed. Rep. of Germany .

*Primary Examiner*—Ramon O. Ramirez
*Assistant Examiner*—Korie H. Chan
*Attorney, Agent, or Firm*—Spencer, Frank & Schneider

[57] ABSTRACT

The guide rails for the circuit boards of a component carrier are provided with centering pins on their undersides and with a spring elastic holding clamp at one end as fastening element whose base is attached to the underside and whose holding tongue is bent in the direction toward the centering pin, with the distance of the front edge of the holding tongue from the centering pin being slightly greater than the distance of the front edge of the long holes of the module rails from the front edge of the longitudinal web of the module rails. At the other end of the guide rails a resilient clamping web projects as a second fastening element parallel to the centering pin. The free end of the clamping web is provided with a clamping shoulder oriented toward the centering pin for gripping around the front edge of the longitudinal web of the module rails.

7 Claims, 2 Drawing Sheets

Fig. 1
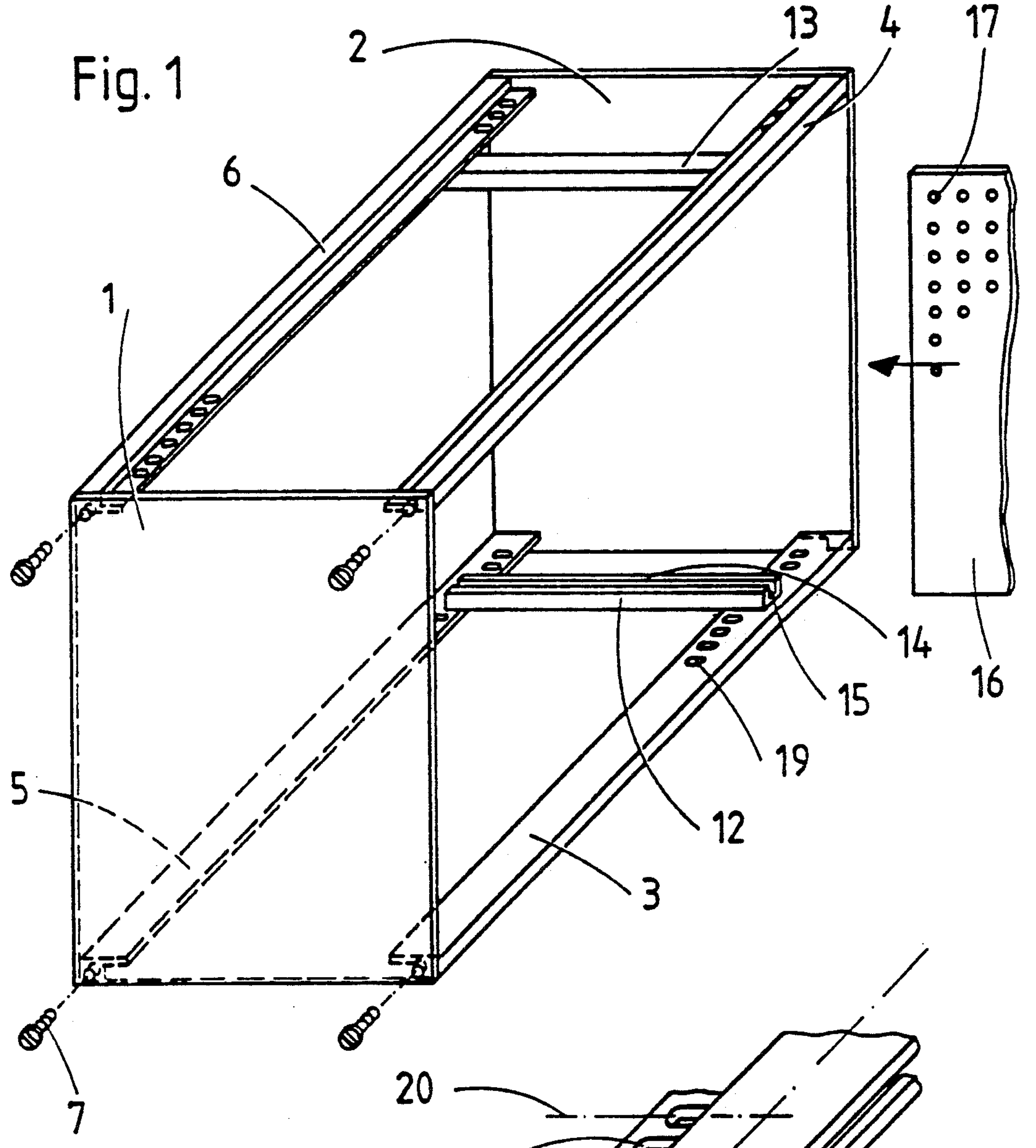
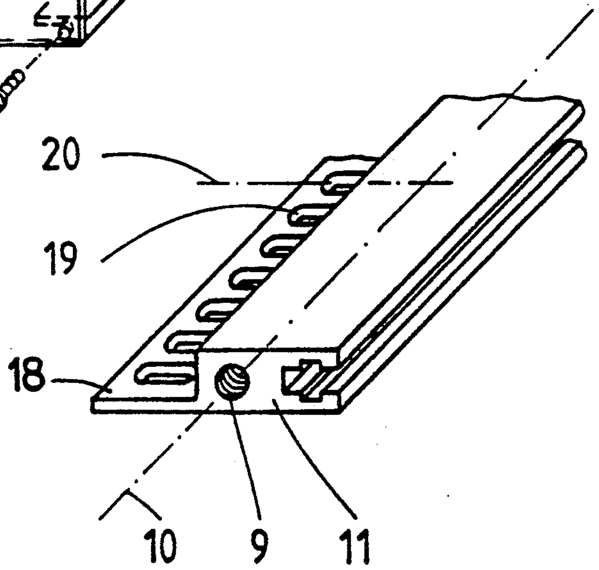
Fig. 2

12,13
21
31
24
38
25
d
22
42
D
3,4
35
Z
28
27
29
26
30
40
41
37
36
39
A
19
23
5,6
19'
33
34
32
18
15
19''
l

COMPONENT CARRIER

CROSS REFERENCE TO RELATED APPLICATION

This application claims the priority of Application Ser. No. P 40 26 396.7, filed Aug. 21, 1990, in the Federal Republic of Germany, the subject matter of which is incorporated herein by reference.

BACKGROUND OF THE INVENTION

The present invention relates to a component carrier for insertable circuit boards that are equipped with electronic components. The component carrier includes forward and rear module rails provided with rows of equidistant holes and guide rails provided on their upper side with guide grooves for the circuit boards and at their undersides at each end with at least one perpendicularly projecting centering pin that engages in at least one hole of the module rails. The guide rails further include at least one resilient fastening element for clamping them to the module rails.

The present invention is employed on component carriers for insertable circuit boards of any type and size which are equipped with upper and lower parallel guide rails for the circuit boards and are releasably fastened to the module rails.

Guide rails are known which are made of plastic and extend in pairs between the front and rear, and the upper and lower module rails. They are provided with a longitudinal groove for the circuit boards and with centering pins at their undersides with which they are inserted into holes in the module rails. In addition to the centering pins, identically configured fastening elements are provided on both sides permitting fixing of the guide rail to the two module rails. For this purpose, the latter are provided with T-shaped grooves into which the resilient fastening means are able to snap.

Each one of the prior art guide rails, once clamped at its front and rear to the two module rails, constitutes a stable, form locking connection between the front and rear module rail because the centering pins are firmly and tightly clamped into the holes of the module rails. This type of fastening of the guide rails to the module rails requires that the spacing of the module rails is very accurate and there are close manufacturing tolerances for the guide rails. Otherwise there will be considerable difficulties and lost time during assembly. Additionally, this type of fastening is unable to yield to thermal expansions of the guide rails and/or of the component carrier—insofar as the spacing of the front and rear module rails or the length of the guide rails are changed thereby. The changes in length under consideration here due to the influence of the heat dissipated by the electrical components result in bending of the guide rail and of the module rails.

SUMMARY OF THE INVENTION

It is an object of the present invention to conceive a manner of fastening for the circuit board guide rail to the module rails of a component carrier with which manufacturing and assembly tolerances can be compensated and which is able to yield to thermal expansions of the participating components.

The solution of this problem is based on a component carrier for insertable circuit boards that are equipped with electrical components. Such a component carrier includes front and rear module rails equipped with rows of equidistant holes and guide rails equipped on their upper sides with guide grooves for the circuit boards and at their undersides, at each end, with at least one perpendicularly projecting centering pin that engages in a hole in the module rail and at least one resilient fastening element for clamping the rail to the module rails.

The problem at hand is solved in that the module rails are equipped with planar lateral longitudinal webs in which the holes are provided. The holes in the module rails are long holes whose longitudinal axes extend transversely to the longitudinal direction of the module rails. At one end of each guide rail, a spring elastic holding clamp is provided as fastening element with its base being attached to the underside and its holding tongue being bent in the direction toward the centering pin. The distance of the front edge of the holding tongue from the centering pin is slightly greater than the distance of the front edge of the long holes from the front edge of the longitudinal web of the module rails and the clearance between the free end of the holding tongue and the underside of the guide rail is somewhat smaller than the thickness of the longitudinal web of the module rails. At the other end of the guide rail, a resilient clamping web projects parallel to the centering pin as the second fastening element. The free end of the clamping web is provided with a clamping shoulder that is oriented toward the centering pin for surrounding the front edge of the longitudinal web of the module rails. The clearance between the clamping shoulder and the centering pin is slightly less than the distance of the front edge of the long holes from the front edge of the longitudinal webs of the module rails.

Consequently, the problem is solved with the aid of two different fastening means, namely a holding clamp at one end that cooperates with long holes and a clamping web at the other end of each guide rail. As for the supports of a bridge (a movable support at one shore and a fixed support at the other) the spring elastic holding clamp permits displacement of the centering pins arranged next to it in their long holes while the clamping web, once snapped into the end position, tightly clamps the oppositely disposed centering pins in their long holes and fixes them against displacement. The long holes of both module rails permit easy assembly of the guide rails since even greater manufacturing and assembly tolerances are unable to cause malfunctions due to the permissible longitudinal play of the centering pins.

A reliable compensation of the manufacturing and assembly tolerances can take place if the length of the long holes corresponds at least to twice the diameter of the centering pin.

For manufacturing technology reasons it is advisable for the holding clamp and the clamping web to be shaped to the guide rail.

Good cooperation between the holding clamp and the module rail results if the base of the holding clamp is attached to the underside of the guide rail at a right angle and the holding tongue lies at an acute angle relative to the underside.

The insertion of the guide rail is facilitated if the front edge of the holding tongue is given a slope.

The front edge of the clamping shoulder may have a slope. This measure permits the clamping shoulder to easily slide over the front edge of the longitudinal web of the module rail, thus facilitating assembly.

The holding of the guide rail in the two module rails is improved if two juxtaposed centering pins are provided at each end of the guide rail.

BRIEF DESCRIPTION OF THE DRAWINGS

The invention will now be described in greater detail for one embodiment thereof with reference to two sheets of drawings. The drawing figures show the following, in a somewhat simplified illustration:

FIG. 1, a perspective, reduced illustration of a component carrier for insertable circuit boards, the carrier being equipped with module rails and guide rails;

FIG. 2, a slightly enlarged perspective partial view of a module rail according to the invention of the component carrier of FIG. 1;

DETAILED DESCRIPTION OF THE PREFERRED EMBODIMENT

Figures 3, 4, 5:
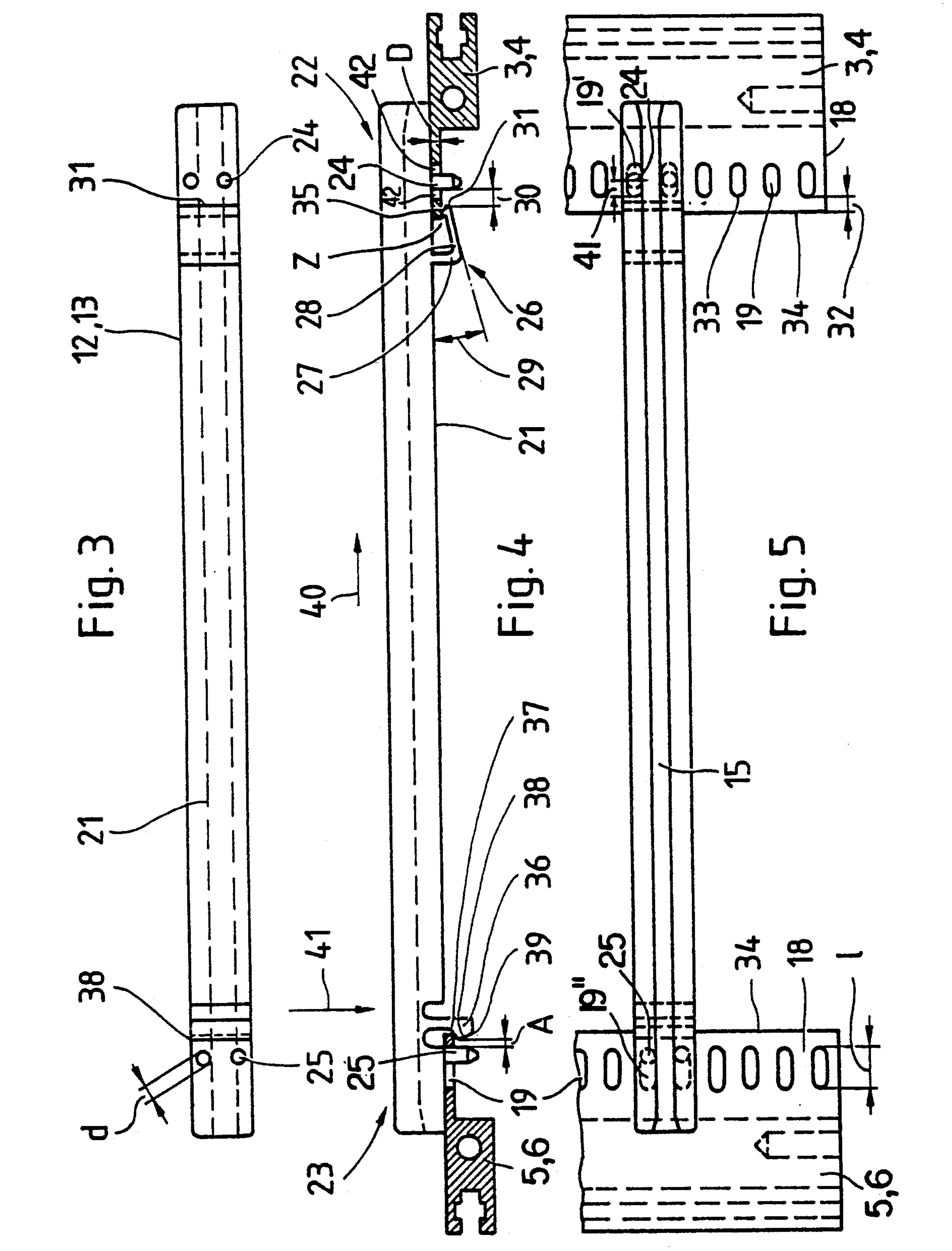
FIG. 3, a somewhat enlarged horizontal projection, seen from the bottom, of a guide rail configured according to the invention in the component carrier of FIG. 1.
FIG. 4, a side view of the guide rail of FIG. 3 fastened to a front module rail and a rear module rail according to FIG. 2.
FIG. 5, a horizontal projection of the guide rail of FIG. 4 but seen from the top.

The component carrier shown in FIG. 1 which is intended for insertable circuit boards that are equipped with electrical and electronic components is composed of two rectangular parallel side walls 1 and 2, two front module rails 3 and 4 and two rear module rails 5 and 6.

The four module rails 3 to 6 which have identical aluminum profiles lie parallel to one another and are screwed on in the region of the four corners of side walls 1 and 2 by means of head screws 7 that are brought through holes in side walls 1 and 2 and are screwed into threaded holes 9 provided in longitudinal direction 10 from end faces 11 in module rails 3 to 6.

Upper and lower guide rails 12 and 13 are clamped by means of resilient fastening elements to one of the front module rails 3 and 4 and one of rear module rails 5 and 6 transversely to module rails 3 to 6, with these fastening elements being snapped into holes arranged in equidistant rows in the longitudinal direction 10 of module rails 3 to 6.

Each one of the identical guide rails 12 and 13 is provided on its upper side 14 with a guide groove 15 of rectangular cross section for a circuit board 16 to be inserted that is provided with hole arrangements 17 and with conductive paths for the components.

Module rails 3, 4, 5 and 6 are each provided with a shaped-on, planar, thin longitudinal web 18—see FIG. 2—which is arranged on their side and extends in the longitudinal direction 10. This longitudinal web 18 is provided with holes for the fastening elements of guide rails 12, 13. The holes are long holes 19 whose longitudinal axes 20 lie at an angle of ninety degrees transversely to the longitudinal direction of module rails 3 to 6.

Two identical, shaped on cylindrical centering pins 24 and 25 project perpendicularly from each end 22, 33 of the planar underside 21 of guide rails 12, 13. If guide rail 12, 13 is clamped on, these centering pins 24 and 25 engage in the long holes 19 of module rails 3 to 6. The length 1 of long holes 19 is twice the diameter d of centering pins 24, 25.

At one end 22 of each guide rail 12, 13 there is provided (see FIG. 4) a shaped-on holding clamp 26 as fastening means which, seen from the side, has an L-shaped profile. This spring elastic holding clamp 26 has its base 27 attached at a right ,angle to the underside 21 and changes into a holding tongue 28 which is bent in the direction toward centering pins 24 so that it forms an acute angle 29 of about 10 angular degrees with underside 21.

The distance 3 of front edge 31 of holding tongue 28 from the two centering pins 24 is slightly greater (FIG. 5) than the distance 32 of the front edge 33 of long holes 19 from the front edge 34 of longitudinal web 18 of module rails 3 to 6. Moreover, the space Z between the front edge 31 of holding tongue 28 and the underside 21 of guide rails 12, 13 (with the guide rail not clamped on) is somewhat smaller than the thickness D of longitudinal web 18 of module rails 3, 4, 5, 6. The frontal face of holding tongue 28 is given a slope 35 which begins at front edge 31.

At the other end 23 of guide rail 12, 13 parallel to centering pins 25, a resilient clamping web 36 projects as the second fastening element that is shaped to the underside 21. The free end of this clamping web 36 has a clamping shoulder 37 which is oriented toward the centering pins 25 and which, with guide rail 12, 13 clamped to module rail 3 to 6, grips around the front edge 34 of longitudinal web 18 of module rail 3 to 6 (see FIG. 4). The front edge 38 of clamping shoulder 37 has a slope 39. The clearance A between clamping shoulder 37 and centering pin 25 is slightly less than the distance 32 of the front edge 34 of long holes 19 from the front edge 34 of longitudinal webs 18 of module rails 3, 4, 5, 6.

In order to clamp a guide rail 12 or 13 according to the invention to a front and rear module rail 3, 4 and 5, 6 of this novel design, the centering pins 24 seated at the one end 22 are initially pushed into two juxtaposed long holes 19 of the one module rail 3, 4 (for example, the front module rail). Then guide rail 12, 13 is displaced somewhat in the direction toward these guide pins 24 (in FIG. 4 in the direction of arrow 40) until the centering pins 25 projecting at the other end 23 can be inserted somewhat into the corresponding long holes 19 of the oppositely disposed (rear) module rail 5, 6; this causes the slope 35 of holding clamp 26 to move up the front edge 34 of the front module rail 3, 4. Now the other end 23 of guide rail 12, 13 is pressed in the direction of arrow 41 against the rear module rail 5 or 6, respectively; the front edge 34 of longitudinal web 18 slides along the slope 39 of clamping web 36 and presses clamping web 36 away from centering pin 25 until clamping shoulder 37 surrounds front edge 34 and snaps in there. At the other end 22, the resilient holding clamp 26 urges guide rail 12 onto the front module rail 3, 4 and thus prevents it from lifting off. After it has been clamped to the two module rails 3, 4 and 5, 6, guide rail 12, 13 is mounted at its one end 22 in long holes 19 corresponding to the support of a bridge so that it is displaceable transverse to longitudinal direction 10 of the (front) module rail 3, 4 and is secured against lifting off by holding clamp 26, while its other end 23 is secured by means of clamping web 36 in long holes 19 of the (rear) module rail 5, 6 against lifting off and against displacement. This is so, because, as it may be observed in FIGS. 4 and 5, the center-to-center distance between a hole 19′ in the front module rail 3 or 4 and the aligned hole 19″ in the rear module rail 5 or 6 is greater than the center-to-center distance between the pin 24 at the end 22 of the guide rail 12 and a longitudinally aligned pin 25 at the end 23 of the guide rail 12 to such an extent that when the pin 25 abuts that end of the hole 19″ which is closest to the front edge 34, the pin 24 is situated in the hole 19′ at a clearance 42 from both ends of the hole 19′. As a result, the end 23 of the guide rail 12 is held against a longitudinal displacement by the cooperation between the clamping web 36 and the pin 25, while the other end 22 of the guide rail 12 may shift (as urged, for example, by forces derived from heat expansion) to the extent permitted by the free travel of the pin 24 in the hole 19′.

It will be understood that the above description of the present invention is susceptible to various modifications, changes and adaptations, and the same are intended to be comprehended within the meaning and range of equivalents of the appended claims.

What is claimed is:

1. A carrier for insertable circuit boards, comprising (a) first and second parallel-spaced module rails each having a length dimension and a longitudinal front edge facing one another;

(b) means for defining a series of spaced, elongated holes in said first and second module rails; the elongated holes in said first module rail being aligned with the elongated holes in said second module rail; each said elongated hole having a length dimension oriented perpendicularly to the length dimension of said module rails and each said elongated hole having opposite, first and second longitudinal hole ends; the first longitudinal hole end of each said elongated hole being situated adjacent the front edge of the respective said module rail;

(c) a guide rail having a first end supported on said first module rail and a second end supported on said second module rail; said guide rail further having an underside oriented towards said module rails and an upper side including means for slidably receiving a circuit board therein; said guide rail having a length dimension oriented perpendicularly to the length dimension of said module rails;

(d) first and second centering pins attached to and extending from said underside at said first and second ends of said guide rail, respectively; said first centering pin extending into a selected one of said elongated holes in said first module rail and being at a clearance from each of the longitudinal hole ends; said second centering pin extending into a selected one of said elongated holes in said second module rail and abutting the first longitudinal hole end therein;

(e) an elastic holding clamp secured to said underside at said first end of said guide rail; said resilient holding clamp has a base portion extending perpendicularly to said underside of said guide rail and a holding tongue attached to said base portion and extending at an acute angle to said underside; said holding tongue being situated between said first centering pin and said front edge of said first module rail; said holding tongue resiliently engaging a face portion of said first module rail for resiliently urging said guide rail and said first module rail into a face-to-face contact with one another and allowing displacement of said first end of said guide rail in a direction parallel to the length dimension thereof to an extent permitted by said clearance; and (f) a clamping web secured to said underside at said second end of said guide rail; said clamping web being essentially in an abutting relationship with said front edge of said second module rail, whereby said second pin and said clamping web together prevent displacement of said second end of said guide rail parallel to the length dimension thereof; said clamping web having a resilient shoulder extending around said second front edge and engaging a surface of said second module rail for preventing a separation between said second end of said guide rail and said second module rail.

2. A carrier as defined in claim 1, wherein the length of each said elongated hole is at least twice the diameter of said centering pins.

3. A carrier as defined in claim 1, wherein said resilient holding clamp, said clamping web and said guide rail constitute a one-piece component.

4. A carrier as defined in claim 1, wherein said holding tongue slopes toward said underside as viewed from said base portion.

5. A carrier as defined in claim 1, wherein said shoulder of said clamping web has a sloped surface for assisting in a snap-in engagement of said shoulder around said front edge of said guide rail.

6. A carrier as defined in claim 1, wherein there are provided two first centering pins situated side-by-side at said first end of said guide rail and two second centering pins situated side-by-side at said second end of said guide rail; each said centering pin being received in a separate one of said elongated holes.

7. A carrier as defined in claim 1, wherein each module rail comprises a longitudinal web extending along the length dimension of the module rail; said elongated holes being provided in said longitudinal web.

* * * * *